(12) United States Patent
Nakamura

(10) Patent No.: US 8,952,598 B2
(45) Date of Patent: Feb. 10, 2015

(54) PIEZOELECTRIC ACTUATOR, PIEZOELECTRIC VIBRATION APPARATUS AND PORTABLE TERMINAL HAVING A REGION THAT IS NOT FLAT FOR BONDING TO A FLEXIBLE SUBSTRATE

(75) Inventor: Shigenobu Nakamura, Kirishima (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 13/985,620

(22) PCT Filed: Aug. 31, 2012

(86) PCT No.: PCT/JP2012/072198
§ 371 (c)(1),
(2), (4) Date: Aug. 15, 2013

(87) PCT Pub. No.: WO2013/171913
PCT Pub. Date: Nov. 21, 2013

(65) Prior Publication Data
US 2014/0055932 A1    Feb. 27, 2014

(30) Foreign Application Priority Data

May 12, 2012  (JP) ................................ 2012-110132

(51) Int. Cl.
*H01L 41/047*  (2006.01)
*H01L 41/083*  (2006.01)
(Continued)

(52) U.S. Cl.
CPC .......... *H01L 41/0472* (2013.01); *H01L 41/083* (2013.01); *H01L 41/0986* (2013.01); *H04R 17/00* (2013.01); *B06B 1/0611* (2013.01); *H01L 41/0475* (2013.01); *H04R 2499/11* (2013.01)

USPC .......................................... 310/365; 310/328

(58) Field of Classification Search
CPC ...................................................... H01L 41/083
USPC .......................................... 310/328, 365–366
See application file for complete search history.

(56) References Cited

U.S. PATENT DOCUMENTS 6,231,811 B1 *  5/2001  Namerikawa et al. ....... 422/68.1
6,825,593 B2    11/2004  Takeshima
(Continued)

FOREIGN PATENT DOCUMENTS

JP   06-014396 A    1/1994
JP   2002-010393 A  1/2002
(Continued)

OTHER PUBLICATIONS

Japanese Office Action with English concise explanation, Japanese Patent Appln. No. 2013-516890, Oct. 2, 2013, 8 pp.

*Primary Examiner* — J. San Martin
(74) *Attorney, Agent, or Firm* — Volpe and Koenig, P.C.

(57) ABSTRACT

A piezoelectric actuator, a piezoelectric vibration apparatus and a portable terminal are disclosed. The actuator includes a piezoelectric element, a flexible substrate and a bonding layer. The piezoelectric element includes a laminate in which inner electrodes and piezoelectric layers are alternatively stacked; and surface electrodes on a first main surface of the laminate, each electrically connected to some of the inner electrodes, respectively. The flexible substrate includes a wiring conductor that is electrically connected to the surface electrodes. The bonding layer is located between a part of flexible substrate and the first main surface. At least a region, where the flexible substrate is bonded, of the first main surface has a flatness worse than a flatness of an second main surface which is opposed to the first main surface.

9 Claims, 7 Drawing Sheets

(51) Int. Cl.
*H01L 41/09* (2006.01)
*H04R 17/00* (2006.01)
*B06B 1/06* (2006.01)

(56) References Cited

U.S. PATENT DOCUMENTS

| | | | |
|---|---|---|---|
| 6,864,620 B2 * | 3/2005 | Takeuchi et al. | 310/334 |
| 2007/0177746 A1 | 8/2007 | Kobayashi et al. | |
| 2010/0187952 A1 | 7/2010 | Fukase et al. | |
| 2013/0135242 A1 | 5/2013 | Tsurusaki | |

FOREIGN PATENT DOCUMENTS

| | | |
|---|---|---|
| JP | 2003069100 A | 3/2003 |
| JP | 2005-125521 A | 5/2005 |
| JP | 2006222184 A | 8/2006 |
| JP | 2006-238072 A | 9/2006 |
| JP | 2008-085537 A | 4/2008 |
| JP | 2010062494 A | 3/2010 |
| JP | 2011199206 A | 10/2011 |
| WO | 2005/004535 A1 | 1/2005 |
| WO | 2009/016843 A1 | 2/2009 |
| WO | 2012057214 A1 | 5/2012 |

* cited by examiner (a)

(PRIOR ART)

(b)

(PRIOR ART)

PIEZOELECTRIC ACTUATOR, PIEZOELECTRIC VIBRATION APPARATUS AND PORTABLE TERMINAL HAVING A REGION THAT IS NOT FLAT FOR BONDING TO A FLEXIBLE SUBSTRATE

FIELD OF ART

Known are piezoelectric actuators (Patent Literature 1) that use bimorph-type piezoelectric elements 10, as shown in FIGS. 7A and 7B, in which surface electrodes 104 are formed on a surface of a laminate 103 in which a plurality of internal electrodes 101 and piezoelectric layers 102 are stacked, and piezoelectric actuators (Patent Literature 2) in which a flexible substrate 105 is bonded to a main surface of a piezoelectric element 10 with a conductive bonding member 106 and the surface electrodes 104 of the piezoelectric element 10 are electrically connected to a wiring conductor 107 on the flexible substrate 105.

BACKGROUND ART

Known are piezoelectric actuators (Patent Literature 1) that use bimorph-type piezoelectric elements 10, as shown in FIGS. 7A and 7B, in which surface electrodes 104 is formed on a surface of a laminate 103 in which a plurality of internal electrodes 101 and piezoelectric layers 102 are stacked, and piezoelectric actuators (Patent Literature 2) in which a flexible substrate 105 is bonded to a main surface of a piezoelectric element 10 with a conductive bonding member 106 and the surface electrodes 104 of the piezoelectric element 10 is electrically connected to a wiring conductor 107 on the flexible substrate 105.

Also known are piezoelectric vibration apparatus (Patent Literature 3 and 4) in which an end or a central portion of a bimorph-type piezoelectric element in the length direction is fixed to a vibrating plate.

CITATION LIST

Patent Literature

Patent Literature 1: Japanese Unexamined Patent Application Publication No. 2002-10393
Patent Literature 2: Japanese Unexamined Patent Application Publication No. H06-14396
Patent Literature 3: International Application Publication No. 2005/004535
Patent Literature 1: Japanese Unexamined Patent Application Publication No. 2006-238072

SUMMARY OF INVENTION

Technical Problem to be Solved

However, in known piezoelectric actuators, since a flexible substrate 105 is bonded to a main surface of a piezoelectric element having good flatness, the flexible substrate 105 undergoes abnormal vibrations that do not follow vibrations of the actuator due to external vibrations and/or resonance of the flexible substrate 105 itself, and therefore, a load induced by stress concentration particularly acts on the base portion of the bonded portion, thereby causing a problem of separation of the flexible substrate 105 from the piezoelectric element.

The present invention has been made to address the problem described above, and its objective is to provide a piezoelectric actuator that can stably operate for a long time without causing separation of the flexible substrate bonded to the piezoelectric element from the piezoelectric elements despite long drive, a piezoelectric vibration apparatus, and a portable terminal.

Solution to Problem

A piezoelectric actuator of the present invention, includes a piezoelectric element which includes: a laminate in which inner electrodes and piezoelectric layers are stacked; and surface electrodes on a one main surface of the laminate, electrically connected to the inner electrodes; and a flexible substrate comprising a wiring conductor that is electrically connected to the surface electrodes, a part of the flexible substrate being bonded to the one main surface via a conductive bonding member, wherein at least a region, where the flexible substrate is bonded, of the one main surface has a flatness worse than that of an other main surface.

A piezoelectric vibration apparatus of the present invention includes the piezoelectric actuator, and a vibrating plate bonded to the other main surface of the piezoelectric element.

A portable terminal of the present invention includes the piezoelectric actuator, an electronic circuit, a display and a housing, wherein the other main surface of the piezoelectric actuator is bonded to the display or the housing.

Effects of Invention

According to the present invention, it is possible to obtain a piezoelectric actuator that can stably operate for a long time without causing separation of the flexible substrate bonded to the piezoelectric element from the piezoelectric elements despite long drive.

DESCRIPTION OF EMBODIMENTS

An example of a piezoelectric actuator according to an embodiment of the present invention will now be described in detail with reference to the drawings.

Figure 1A:
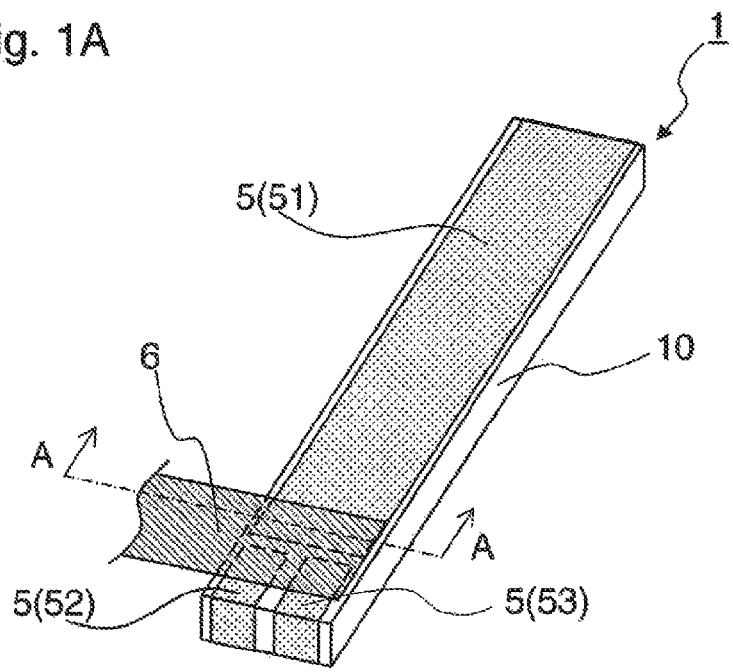
FIG. 1A is a perspective view showing a piezoelectric actuator according to an embodiment of the present invention.
Figure 1B:
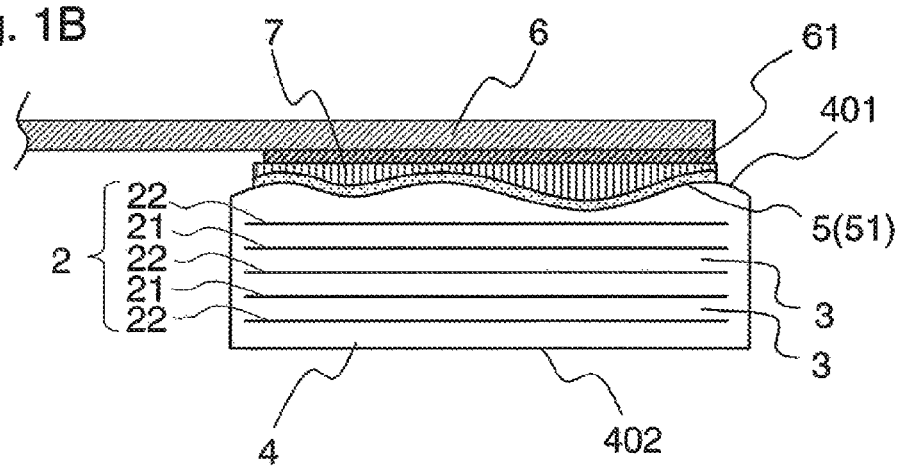
FIG. 1B is a cross-sectional view taken along the line A-A of FIG. 1A.

FIG. 1A is a perspective view showing a piezoelectric actuator according to an embodiment of the present invention, and FIG. 1B is a cross-sectional view taken along the line A-A of FIG. 1A.

A piezoelectric actuator 1 shown in FIGS. 1A and 1B according to the present embodiment includes a piezoelectric element 10 that includes: a laminate 4 in which inner electrodes 2 and piezoelectric layers 3 are stacked and surface electrodes 5 electrically connected to the inner electrodes 2 and formed on a one main surface 401 of the laminate 4; and a flexible substrate 6 that includes a wiring conductor 61 electrically connected to the surface electrodes 5 and is partly bonded to the one main surface 401 with a conductive bonding member 7. The flatness of the one main surface 401 at least in a region bonded to the flexible substrate 6 is worse than that of an other main surface 402.

The laminate 4 constituting the piezoelectric element 10 is obtained by stacking the inner electrodes 2 and the piezoelectric layers 3, includes an active portion 41 in which the inner electrodes 2 are superposed on one another in the stacking direction and an inactive portion 42 which constitutes the rest, and has, for example, an elongated shape. The length of the laminate 4 is, for example, preferably 18 mm to 28 mm and more preferably 22 mm to 25 mm for piezoelectric actuators to be installed in displays or housings of portable terminals. The width of the laminate 4 is, for example, preferably 1 mm to 6 mm and more preferably 3 mm to 4 mm. The thickness of the laminate 4 is, for example, preferably 0.2 mm to 1.0 mm and more preferably 0.4 mm to 0.8 mm.

The inner electrodes 2 constituting the laminate 4 are formed by co-firing with ceramics that form the piezoelectric layers 3, and are composed of first inner electrodes 21 and second inner electrodes 22. For example, the first inner electrodes 21 serve as ground electrodes and the second inner electrodes 22 serve as positive or negative electrodes. The inner electrodes 2 alternately stacked with the piezoelectric layers 3 to sandwich the piezoelectric layers 3 in the vertical direction, since the first inner electrodes 21 and the second inner electrodes 22 are arranged in the order of stacking, a drive voltage can be applied to the piezoelectric layers 3 sandwiched between these. A conductor mainly composed of silver having low reactivity with piezoelectric ceramics or a silver-palladium alloy, or a conductor that contains copper, platinum, or the like may be used as the material for forming the inner electrodes, and a ceramic component and/or a glass component may also be added to these materials.

In the example shown in FIGS. 1A and 1B, the ends of the first inner electrodes 21 and the ends of the second inner electrodes 22 are alternately extracted in a pair of opposing side surfaces of the laminate 4. The length of the inner electrodes 2 is, for example, preferably 17 mm to 25 mm and more preferably 21 mm to 24 mm for piezoelectric actuators to be installed in displays or housings of portable terminals. The width of the inner electrodes 2 is, for example, preferably 1 mm to 5 mm, and more preferably 2 mm to 4 mm. The thickness of the laminate 4 is, for example, preferably 0.1 μm to 5 μm.

The piezoelectric layers 3 constituting the laminate 4 are formed of a ceramic having piezoelectric properties, and for example, as such ceramic, perovskite-type oxides composed of lead titanate zirconate ($PbZrO_3$—$PbTiO_3$), lithium niobate ($LiNbO_3$), and lithium tantalite ($LiTaO_3$) can be used. The thickness of one piezoelectric layer 3 is preferably set to, for example, 0.01 to 0.1 mm in order to achieve low-voltage driving. Also, in order to obtain large bending vibrations, the piezoelectric d31 constant is preferably 200 pm/V or more.

The surface electrodes 5, which is electrically connected to the inner electrodes 2, is disposed on the one main surface 401 of the laminate 4. The surface electrodes 5 in the embodiment shown in FIGS. 1A and 1B is constituted by a first surface electrode 51 having a large area, a second surface electrode 52 having a small area, and a third surface electrode 53 having a small area. For example, the first surface electrode 51 is electrically connected to the inner electrodes 2 that serve as the first inner electrodes 21; the second surface electrode 52 is electrically connected to the inner electrodes 2 that are arranged on the one main surface side and serve as the second inner electrodes 22; and the third surface electrode 53 is electrically connected to the inner electrodes 2 that are arranged on the other main surface 402 side and serve as the second inner electrodes 22. The length of the first surface electrode 51 is, for example, preferably 17 mm to 23 mm and more preferably 19 mm to 21 mm for piezoelectric actuators to be installed in displays or housings of portable terminals. The width of the first surface electrode 51 is, for example, preferably 1 mm to 5 mm and more preferably 2 mm to 4 mm. The lengths of the second surface electrode 52 and the third surface electrode 53 are, for example, preferably 1 mm to 3 mm. The widths of the second surface electrode 52 and the third surface electrode 53 are, for example, preferably 0.5 mm to 1.5 mm.

The piezoelectric actuator 1 also includes the flexible substrate 6 having a part bonded to the one main surface 401 of the laminate 4 constituting the piezoelectric element 10 via the conductive bonding member 7.

The flexible substrate 6 includes the wiring conductor 61, and a part of the flexible substrate 6 is bonded to the one main surface 401 of the laminate 4 in such a manner that the surface electrodes 5 is electrically connected to the wiring conductor 61 through the conductive bonding member 7.

The flexible substrate 6 is, for example, a flexible printed wiring board in which two wiring conductors 61 are embedded in a resin film, and a connector (not shown) for establishing a connection with an external circuit is connected to one end of the substrate.

A conductive adhesive, a solder, or the like is used as the conductive bonding member 7, and a conductive adhesive is preferred. This is because the stress caused by vibrations can be reduced when a conductive adhesive containing, for example, a resin having a low elastic modulus (Young's modulus) such as polyimide, polyamideimide, silicone rubber, or synthetic rubber dispersed with metal powder such as silver powder or gold powder, or resin balls with conductive coatings such as Au plating is used compared to when a solder is used. Among conductive adhesives, anisotropic conductive materials are more preferable. An anisotropic conductive material contains conductive particles responsible for establishing an electrical connection and a resin adhesive responsible for bonding. Since the anisotropic conductive material allows electrical conduction in the thickness direction and insulation in the in-plane direction, electrical short-circuiting is prevented between surface electrodes of different polarities even when the wiring pitch is narrow, and thus the size of a portion connecting to the flexible substrate 6 can be reduced.

As shown in FIG. 1B, the flatness of the first main surface of the laminate 4 of the piezoelectric element 10 in at least the region bonded to the flexible substrate 6 is worse than the flatness of the other main surface 402.

The meaning of bad flatness is that the surface is not relatively flat and has large irregularities or stepped portions. For example, the flatness is 10 to 200 μm.

With the flatness of the region connected to the flexible substrate 6 adjusted to be degraded, when a load induced by stress concentration acts particularly on the base portion of the bonded portion due to abnormal vibrations that do not follow the vibrations of the actuator such as resonance of the flexible substrate itself, the stress can be reduced at the thin portion (such as a recessed portion) of the one main surface 401 of the laminate 4 because the elastic modulus of the conductive bonding member 7 connected to the flexible substrate 6 is low. This is because bonding is solely achieved with the continuous resin and the elastic modulus is low, since at the thin portion (such as a recessed portion), the distance between the flexible substrate 6 and the laminate 4 is extended and thus it is rare that the bonding is achieved with one conductive particle. As a result, the problem of separation of the flexible substrate 6 from the piezoelectric element 10 can be suppressed and long-term stable operation becomes possible. Moreover, since the bonding area with the conductive bonding member 7 can be increased by degrading the flatness, the bonding strength can be enhanced.

Figure 2A:
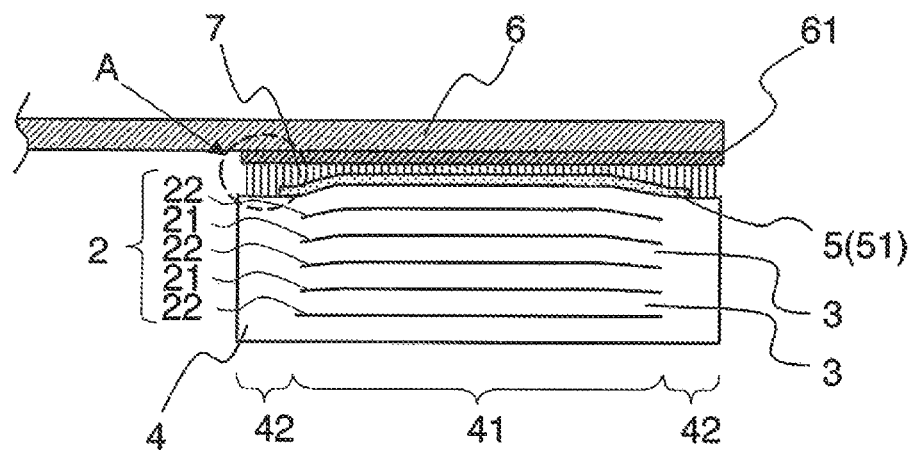
FIG. 2A is a cross-sectional view showing a piezoelectric actuator according to an embodiment of the present invention.
Figure 2B:
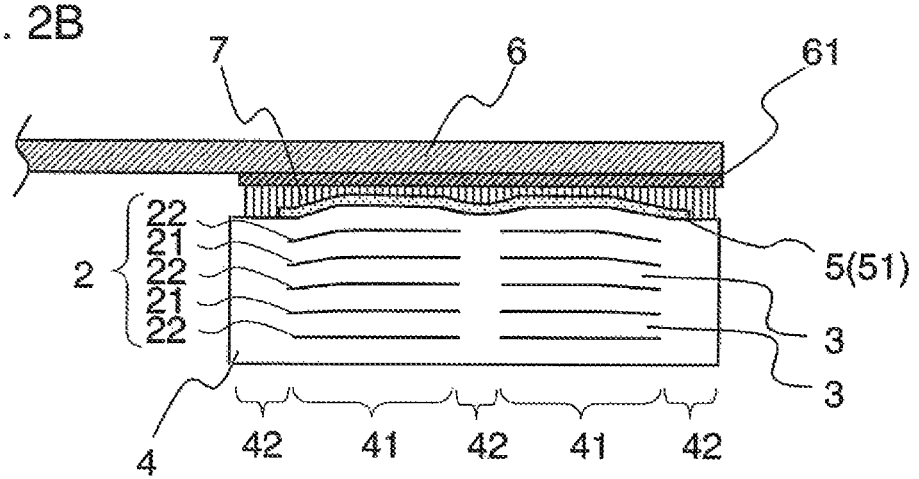
FIG. 2B is a cross-sectional view showing a piezoelectric actuator according to an embodiment of the present invention.

Here, as shown in FIGS. 2A and 2B, the inner electrodes 2 include the first inner electrodes 21 and the second inner electrodes 22, the one main surface is provided with a stepped part between the relatively thick active portion 41 where the first inner electrodes 21 and the second inner electrodes 22 of the inner electrodes 2 are superposed on one another in the stacking direction and the inactive portion 42 which is the rest of the portion (other than the active portion 41) with a relatively small thickness, and the flexible substrate 6 may be bonded to the one main surface over the active portion 41 and the inactive portion 42.

According to this arrangement, a larger amount of the conductive bonding member 7 can be provided in the bonding portion between the relatively thin inactive portion 42 and the flexible substrate 6. Thus, the stress at the bonding portion generated by non-following abnormal vibrations of the flexible substrate 6, in particular, the stress at the bonding portion near the outer periphery of the piezoelectric element 10, can be suppressed, and the reliability of bonding can be enhanced. The inactive portion 42 may be arranged at the outer periphery of the piezoelectric element 10 as shown in FIG. 2A, and also the inactive portion 42 may also be arranged on the inner side of the piezoelectric element 10 as shown in FIG. 2B.

Furthermore, the piezoelectric element 10 may have an elongated shape having a longitudinal direction and a width direction as shown in FIG. 1A; the inner electrodes 2 may include the first inner electrodes 21 and the second inner electrodes 22 as shown in FIG. 2A; a stepped part may be provided on the one main surface between a relatively thick central region in the width direction where the first inner electrodes 21 and the second inner electrodes 22 of the inner electrodes 2 are superposed on one another in the stacking direction and the rest of the portion (the portion other than the central region) which is a relatively thin end region in the width direction; and the flexible substrate 6 may be bonded to the one main surface over the central region in the width direction and the end region in the width direction.

With this structure, a larger amount of the conductive bonding member 7 can be provided in the bonding portion between the relatively thin end region and the flexible substrate 6. Accordingly, cracking of the conductive bonding member 7 from the end region can be suppressed, and the flexible substrate 6 does not separate from the piezoelectric element 10 even when a load is imposed on the base portion of the flexible substrate 6, the base portion being highlighted as region A of FIG. 2A. Even when the flexible substrate 6 undergoes vibrations due to external factors, such vibrations can be absorbed by the larger amount of the conductive bonding member 7 which is provided in the relatively thin end region, and therefore, undesired vibrations in the piezoelectric element 10 can be reduced.

By making the other main surface of the piezoelectric element 10 flat, when the other main surface is bonded to a subject (for example, a vibrating plate described below) to which vibrations are to be applied, together with the subject to which the vibrations are applied, bending vibrations is easily undergone and the efficiency of bending vibrations as a whole can be improved.

While the piezoelectric actuator 1 shown in FIGS. 1A and 1B is a bimorph-type piezoelectric actuator and undergoes bending vibrations in response to electric signals input from the surface electrodes 5 such that the one main surface and the other main surface function as bending surfaces, the piezoelectric actuator is not limited to those of the bimorph type and may be of a unimorph type, and for example, a unimorph-type piezoelectric actuator can undergo bending vibrations when a vibrating plate described below is bonded (attached) to the other main surface of the piezoelectric actuator.

The method for producing the piezoelectric actuator 1 according to the present embodiment will now be described.

First, ceramic green sheets that form the piezoelectric layers 3 are prepared. Specifically, a ceramic slurry is prepared by mixing a piezoelectric ceramic calcined powder, a binder composed of an organic polymer such as an acryl-based and butyral-based polymer, and a plasticizer. Then ceramic green sheets are prepared by using the ceramic slurry by a tape forming method such as a doctor blade method, a calendar roll method. As a piezoelectric ceramic, one having piezoelectric properties may be used, and for example, a perovskite-type oxide composed of lead titanate zirconate ($PbZrO_3$—$PbTiO_3$) can be used. Dibutyl phthalate (DBP), dioctyl phthalate (DOP), or the like can be used as the plasticizer.

Next, a conductive paste that forms the inner electrodes 2 is prepared. Specifically, a conductive paste is prepared by adding and mixing a binder and a plasticizer with a metal powder of a silver-palladium alloy. The conductive paste is applied onto the ceramic green sheets by a screen printing method to form patterns of the inner electrodes 2. A plurality of the ceramic green sheets onto which the conductive paste has been printed are stacked and subjected to a debinding treatment at a particular temperature, fired at a temperature of 900° C. to 1200° C., and polished into a particular shape by using a surface grinding machine or the like to form a laminate 4 that includes alternately stacked inner electrodes 2 and piezoelectric layers 3.

In these production steps, after a plurality of ceramic green sheets on which the conductive paste has been printed are stacked, for example, a recessed metal mold or resin mold is used as an upper-side (one main surface side) mold of a pressing machine and a flat metal mold or resin mold is used as the lower-side (other main surface side) mold of the pressing machine, and the piezoelectric actuator 1 having a shape shown in FIG. 1B is fabricated.

The laminate 4 is not limited to those produced by the above-described production method and may be produced by any production method as long as a laminate 4 that includes inner electrodes 2 and piezoelectric layers 3 stacked can be fabricated.

Then, a silver glass-containing conducive paste prepared by adding a binder, a plasticizer, and a solvent to a mixture of glass and conductive particles mainly composed of silver is printed on main surfaces and side surfaces of the laminate 4 by screen printing or the like to form patterns of the surface electrodes 5, dried, and fired at a temperature of 650 to 750° C. so as to form the surface electrodes 5.

In electrically connecting the inner electrodes 2 to the surface electrodes 5, the connection may be established by forming vias that penetrate the piezoelectric layers 3, or by forming side surface electrodes on the side surfaces of the laminate 4, or may be formed by any other method.

Next, the flexible substrate 6 is connected and fixed (bonded) to the piezoelectric element 10 by using the conductive bonding member 7.

First, a paste for forming a conductive bonding member is applied to a particular position of the piezoelectric element 10 by screen printing method or the like. Subsequently, the paste for forming a conductive bonding member is cured while having the flexible substrate 6 in contact with the piezoelectric element 10 so as to have the flexible substrate 6 connected and fixed to the piezoelectric element 10. Alternatively, the paste for forming the conducive bonding member may be applied to the flexible substrate 6.

When the conductive bonding member 7 is a conductive adhesive and the resin constituting the conductive adhesive is a thermoplastic resin, the conductive adhesive is applied to a particular position of the piezoelectric element 10 or the flexible substrate 6 and then heating and pressurizing are performed while having the piezoelectric element 10 in contact with the flexible substrate 6 via the conductive adhesive, thereby causing the thermoplastic resin to soften and flow, and when returned to room temperature, the thermoplastic resin becomes cured again, and the flexible substrate 6 comes to be connected and fixed to the piezoelectric element 10.

In particular, when an anisotropic conductive member is used as the conductive bonding member 7, the amount of pressure need be controlled to prevent neighboring conductive particles from contacting each other.

In the description above, the technique of applying the conductive adhesive to the piezoelectric element 10 or the flexible substrate 6 has been presented, but alternatively, the conductive adhesive may be formed to have a sheet shape in advance and then heating and pressurizing may be performed while sandwiching the conductive adhesive in a sheet shape between the piezoelectric element 10 and the flexible substrate 6.

Figure 3:
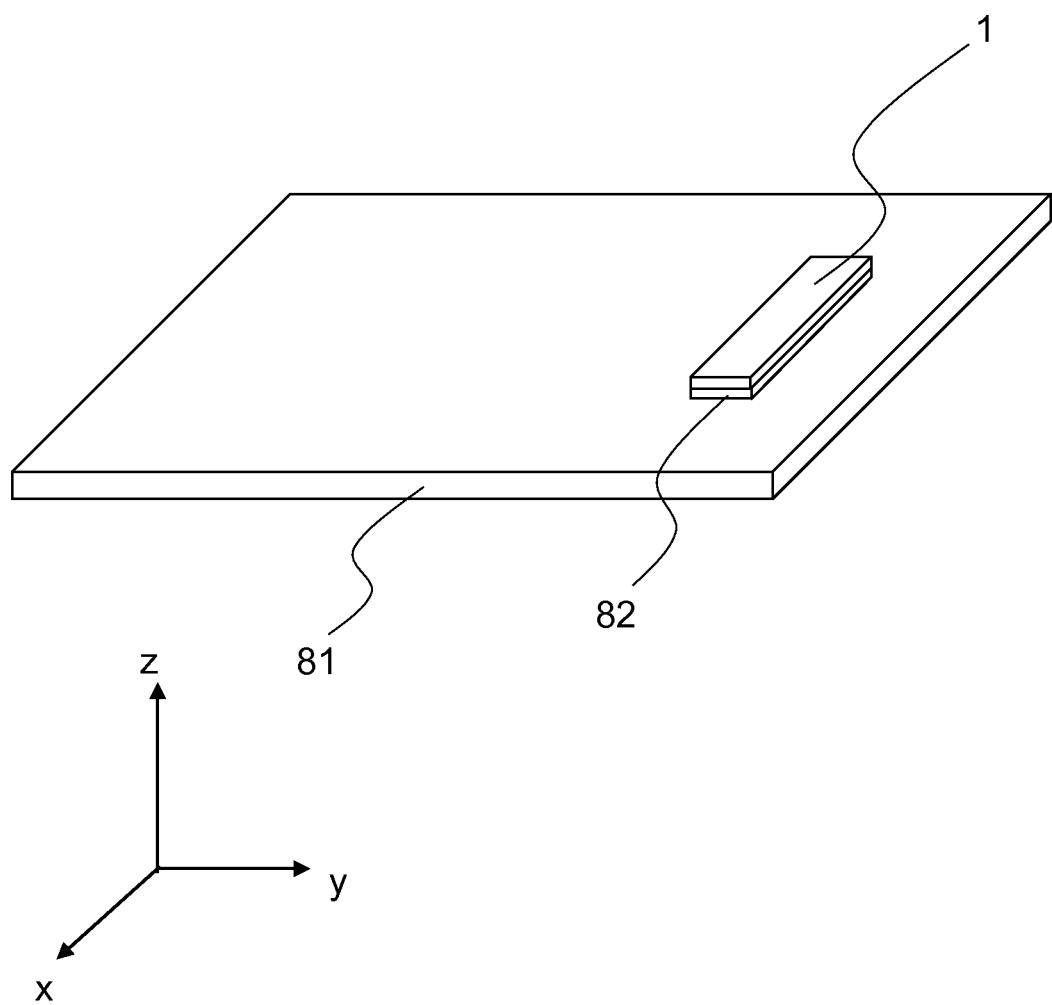
FIG. 3 is a schematic perspective view schematically showing a piezoelectric vibration apparatus according to an embodiment of the present invention.

The piezoelectric vibration apparatus of the present embodiment includes the piezoelectric actuator 1 and a vibrating plate 81 bonded to the other main surface of the piezoelectric actuator 1 as shown FIG. 3.

The vibrating plate 81 has a shape of a rectangular thin plate. The vibrating plate 81 can be formed by appropriately using a material, such as an acrylic resin and glass that has high rigidity and elasticity. The thickness of the vibrating plate 81 is set to, for example, 0.4 mm to 1.5 mm.

The vibrating plate 81 is bonded to the other main surface of the piezoelectric actuator 1 via a bonding member 82. The other main surface may be entirely or substantially entirely bonded to the vibrating plate 81 via the bonding member 82.

The bonding member 82 has a film shape. The bonding member 82 is formed of a material that is softer and easier to deform than the vibrating plate 81 and has lower stiffness and elasticity such as a Young's modulus, modulus of rigidity, and volume elastic modulus, than the vibrating plate 81. In other words, the bonding member 82 is deformable and undergoes larger deformation than the vibrating plate 81 under the same force. The one main surface (the main surface in the +z direction side in the drawing) of the bonding member 82 is bonded to the entire other main surface (the main surface in the −z direction side in the drawing) of the piezoelectric actuator 1, and an other main surface (the main surface in the −z direction side in the drawing) of the bonding member 82 is fixed to a part of the one main surface (the main surface in the +z direction side in the drawing) of the vibrating plate 81.

The bonding member 82 may be a single member or a composite member constituted by several members. For example, a double-faced adhesive tape constituted by a base such as a nonwoven cloth and an adhesive attached to both faces of the base or an elastic adhesive of various types which is an adhesive having elasticity are suitable for use as the bonding member 82. The thickness of the bonding member 82 is preferably larger than the amplitude of the bending vibrations of the piezoelectric actuator 1 but is set to be in the range of 0.1 mm to 0.6 mm, for example, since vibrations are attenuated at an excessively large thickness. However, in the piezoelectric vibration apparatus of the present invention, the material for the bonding member 82 is not particularly limited. The bonding member 82 may be formed of a material that is harder and less deformable than the vibrating plate 81. In some cases, a structure that does not have the bonding member 82 may be employed.

The piezoelectric vibration apparatus of this example having such a structure serves as a piezoelectric vibration apparatus that causes the piezoelectric actuator 1 to undergo bending vibrations in response to electrical signals supplied and causes the vibrating plate 81 to vibrate thereby. An end portion (the end portion in the −y direction in the drawing of the vibrating plate 81 in the length direction, and the peripheral portion of the vibrating plate 81, and the like) may be supported by a supporting member not shown in the drawing.

The piezoelectric vibration apparatus of this example can serve as a piezoelectric vibration apparatus since it includes the piezoelectric actuator 1 in which generation of undesired vibrations is reduced.

In the piezoelectric vibration apparatus of this example, the vibrating plate 81 is bonded to the flat other main surface of the piezoelectric actuator 1. Thus, a piezoelectric vibration apparatus in which the piezoelectric actuator 1 is strongly bonded to the vibrating plate 81 is obtained.

Figure 4:
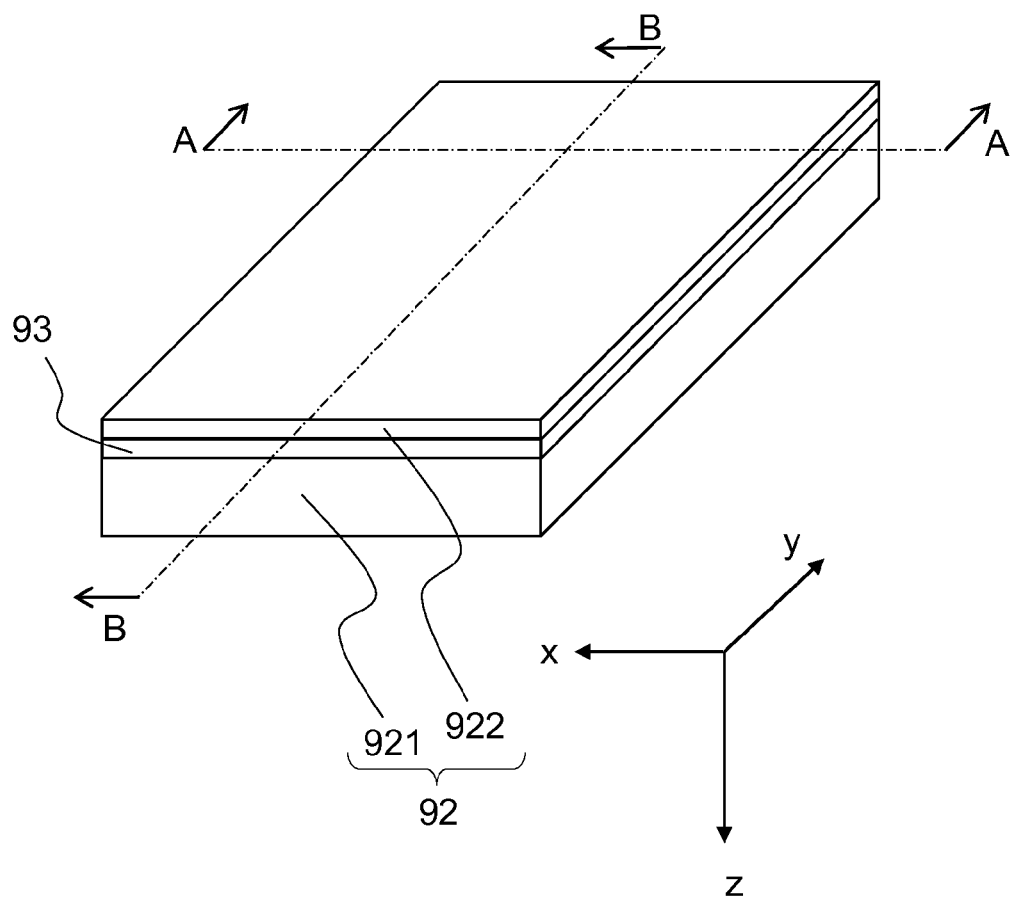
FIG. 4 is a schematic perspective view schematically showing a portable terminal according to an embodiment of the present invention.
Figure 5:
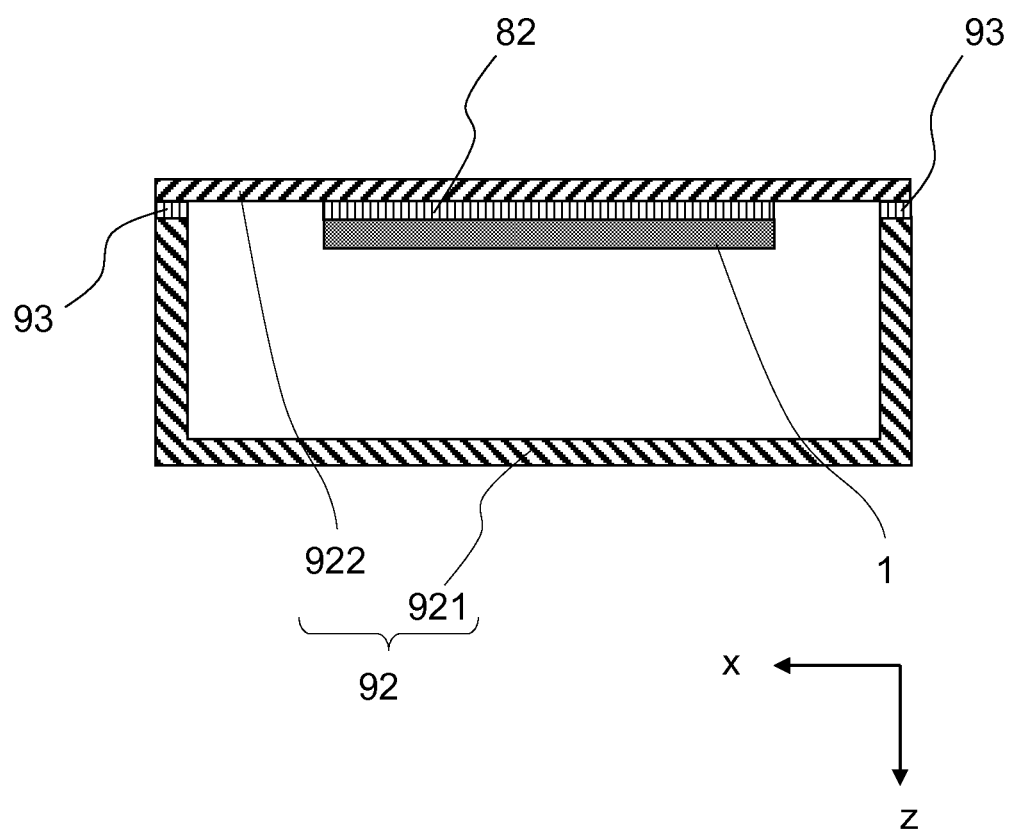
FIG. 5 is a cross-sectional view taken along the line A-A of FIG. 4.
Figure 6:
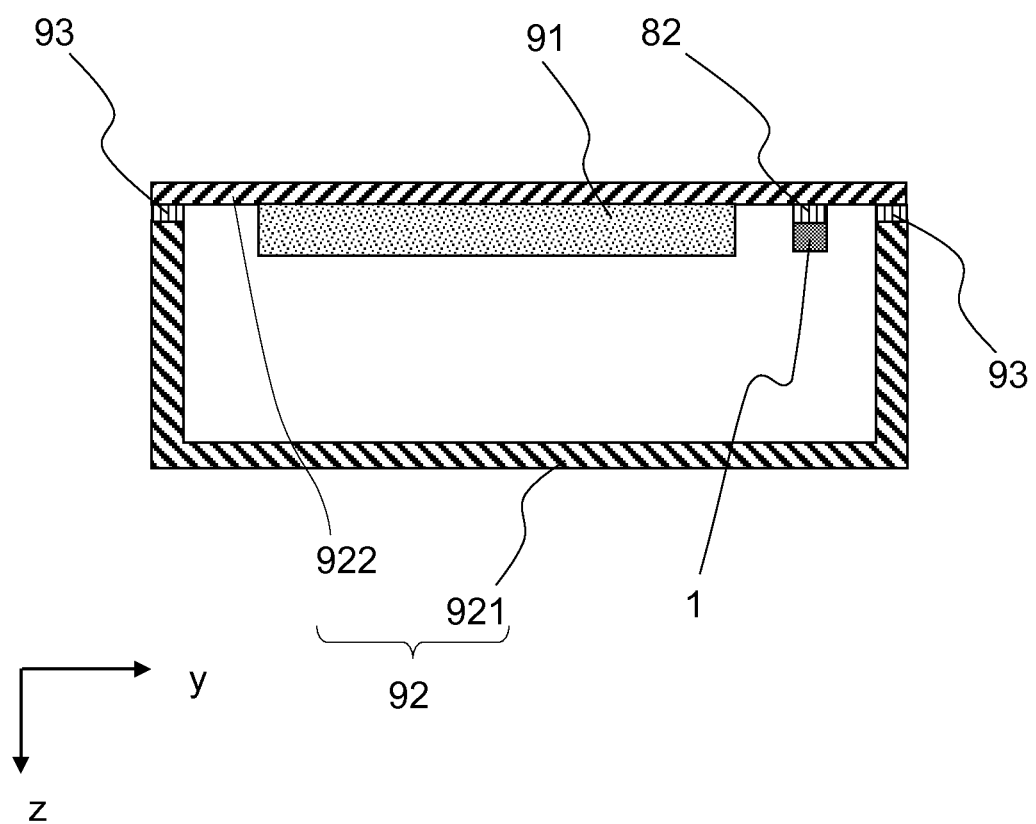
FIG. 6 is a cross-sectional view taken along the line B-B of FIG. 4.
Figure 7:
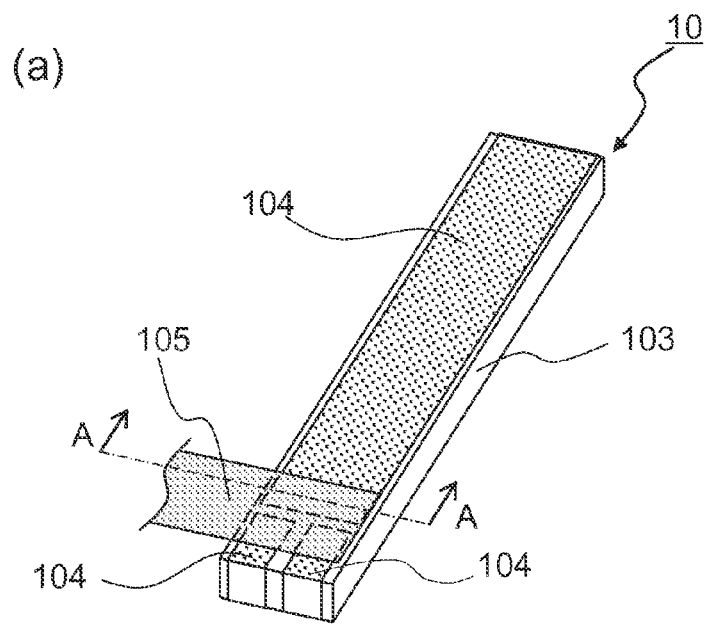
FIG. 7A is a perspective view showing an example of a known piezoelectric actuator.
FIG. 7B is a cross-sectional view taken along the line A-A of FIG. 7A.
Figure 7:
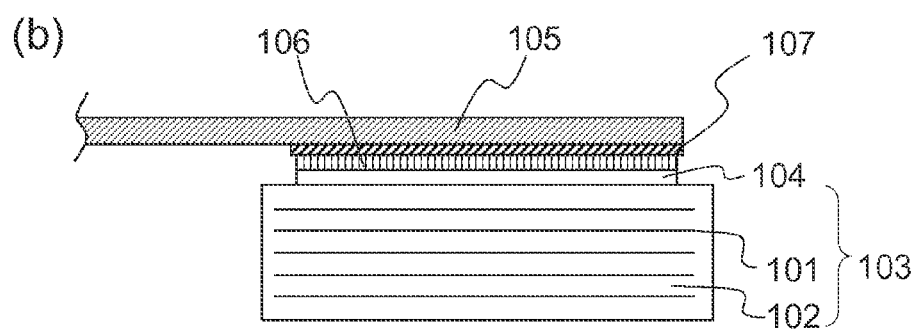

As shown in FIG. 4 to FIG. 6, a portable terminal of the present embodiment includes the piezoelectric actuator 1, an electronic circuit (not shown), a display 91, and a housing 92, and the other main surface of the piezoelectric actuator 1 is bonded to the housing 92. FIG. 4 is a schematic perspective view schematically showing a portable terminal of the present invention, FIG. 5 is a cross-sectional view taken along the line A-A of FIG. 4, and FIG. 6 is a cross-sectional view taken along the line B-B of FIG. 4.

The piezoelectric actuator 1 and the housing 92 are preferably bonded to each other with a bonding member that is deformable. In other words, the bonding member 82 is a deformable bonding member in FIG. 5 and FIG. 6.

Since the piezoelectric actuator 1 is bonded to the housing 92 with the deformable bonding member 82, the deformable bonding member 82 undergoes larger deformation than the housing 92 when vibrations are transmitted from the piezoelectric actuator 1.

In this case, since vibrations of the reverse phase reflected by the housing 92 can be moderated by the deformable bonding member 82, the piezoelectric actuator 1 can transmit strong vibrations to the housing 92 without being affected by the ambient vibrations.

In particular, at least part of the bonding member 82 is preferably composed of a viscoelastic material because strong vibrations from the piezoelectric actuator 1 can be transmitted to the housing 92 and the weak vibrations reflected by the housing 92 can be absorbed with the bonding member 82. For example, a double-faced adhesive tape constituted by a base such as a nonwoven cloth and an adhesive attached to both faces of the base or a bonding member that contains an elastic adhesive can be used as the bonding member, and the thickness thereof is, for example, 10 μm to 2000 μm.

In this example, the piezoelectric actuator 1 is attached to a part of the housing 92 that serves as a cover of the display 91, and a part of the housing 92 functions as a vibrating plate 922.

Although this example showed the piezoelectric actuator 1 that is bonded to the housing 92, the piezoelectric actuator 1 may be bonded to the display 91.

The housing 92 includes a box-shaped housing main body 921 having one open face, and the vibrating plate 922 that covers the opening of the housing main body 921. The housing 92 (housing main body 921 or vibrating plate 922) can be formed by appropriately using a material, such as a synthetic resin, that has high stiffness and high elastic modulus.

The peripheral portion of the vibrating plate 922 is attached to the housing main body 921 via a bonding material 93 so as to be capable of vibrating. The bonding material 93 is formed of a material that is softer and easier to deform than the vibrating plate 922 and has lower elasticity and rigidity properties, such as a Young's modulus, modulus of rigidity, and volume elastic modulus than the vibrating plate 922. In other words, the bonding material 93 is deformable and undergoes larger deformation than the vibrating plate 922 under the same force.

The bonding material 93 may be a single member or a composite member constituted by several members. For example, a double-faced adhesive tape constituted by a base such as a nonwoven cloth and an adhesive attached to both faces of the base is suitable for use as the bonding material 93. The thickness of the bonding material 93 is set not so large to suppress attenuation of vibrations. For example, the thickness is set to 0.1 mm to 0.6 mm. However, the material for the bonding material 93 is not limited in the portable terminal of the present invention, and the bonding material 93 may be formed of a material that is harder and less deformable than the vibrating plate 922. In some cases, a structure that does not have the bonding material 93 may be employed.

Examples of the electronic circuit (not shown) include circuits that process image information to be displayed in the display 91 and sound information to be transmitted through the portable terminal, communication circuits, and the like. The electronic circuit may include at least one of such circuits and may include all of the circuits. The circuit may have other functions. A plurality of electronic circuits may be included. The electronic circuit is connected to the piezoelectric actuator 1 via a connecting wire not shown in the drawing.

The display 91 is a display device that has a function of displaying image information, and for example, a known display such as a liquid crystal display, a plasma display, an organic EL display, or the like, can be appropriately used. The display 91 may be an input device such as a touch panel. The cover (vibrating plate 922) of the display 91 may be an input device such as a touch panel. The entire display 91 or a part of the display 91 may be configured to serve as a vibrating plate.

The portable terminal of the present invention is characterized in that the display 91 or the housing 92 generates vibrations that transmit sound information through ear cartilages or by air conduction. The portable terminal of this example can transmit sound information by bringing the vibrating plate (display 91 or housing 92) into contact with an ear either directly or through another medium so as to conduct vibrations to the ear cartilages. In other words, sound information can be transmitted by conducting vibrations to ear cartilages by bringing the vibrating plate (display 91 or housing 92) into direct or indirect contact with the ear. In this manner, a portable terminal that can transmit sound information even in noisy surroundings can be obtained, for example. The medium that comes between the vibrating plate (display 91 or housing 92) and the ear may be, for example, a cover of the portable terminal, a headphone, an earphone, or any other object that can conduct vibrations. Alternatively, the portable terminal may transmit sound information by causing sound generated from the vibrating plate (display 91 or housing 92) to propagate in air. Yet alternatively, the portable terminal may transmit sound information through a plurality of routes.

Since the portable terminal of this example transmits sound information by using the piezoelectric actuator 1 in which generation of undesired vibrations is reduced, high-quality sound information can be transmitted.

EXAMPLES

A specific example of the piezoelectric actuator of the present invention will now be described. In particular, a piezoelectric actuator shown in FIG. 1 was fabricated as described below.

A piezoelectric element was made to have a rectangular prism with a length of 23.5 mm, a width of 3.3 mm, and a thickness of 0.5 mm. The piezoelectric element had a structure in which piezoelectric layers having a thickness of 30 μm and inner electrodes were alternately stacked. The total number of the piezoelectric layers was 16. The piezoelectric layers were formed of lead titanate zirconate. A silver palladium alloy was used for the inner electrodes.

After ceramic green sheets on which a conductive paste composed of silver palladium had been printed were stacked, the stack was pressed by using a recessed resin mold as the upper side (side that comes into contact with the one main surface) mold of a press machine and a flat metal mold as the lower side (side that comes into contact with the other main surface) mold of the press machine so as to make the active portion thicker than the inactive portion, and a laminate compact having an active portion thicker than an inactive portion was obtained.

Then debinding was performed at a particular temperature, firing was performed at 1000° C., and a sintered laminate compact was obtained.

Next, a surface electrode was printed such that the surface electrode was longer than the inner electrodes by 1 mm at each end.

In the one main surface of the resulting piezoelectric element, the active portion protruded by 50 μm with respect to the inactive portion. The other main surface was substantially flat.

A voltage having a field intensity of 2 kV/mm was applied between the inner electrodes (between the first inner electrodes and between the second inner electrodes) through the surface electrodes and the piezoelectric element was polarized.

Then a conductive adhesive containing gold-plated resin balls as conductive particles was applied to the surface of the piezoelectric element to be bonded to a flexible substrate, heating and pressurizing were performed while having the flexible substrate in contact with the piezoelectric element, and the flexible substrate was fixed to the piezoelectric element while establishing conduction therebetween, and a piezoelectric actuator (Sample No. 1) of Example of the present invention was prepared.

A piezoelectric actuator (Sample No. 2) which was outside the scope of the present invention and had the same structure as Sample No. 1 described above except that both the one main surface and the other main surface were flat was prepared as a comparative example.

A sine wave signal having an effective value of ±10 Vrms at a frequency of 1 kHz was applied to the piezoelectric element of each piezoelectric actuator through a flexible substrate and a drive test was performed, and bending vibrations having a displacement of 100 μm were obtained from both Sample Nos. 1 and 2.

Then sine wave signals were continuously applied for 100,000 cycles to conduct a drive test. Abnormal vibrations occurred in Sample No. 2 which was outside the scope of the present invention, and the flexible substrate was separated from the piezoelectric element on the 90,000-th cycle.

In contrast, the piezoelectric actuator of Sample No. 1 which is an example of the present invention continued to operate without abnormal vibrations even after 100,000 cycles. No cracks or fractures were observed in the conductive adhesive that connected and fixed the flexible substrate and separation of the flexible substrate did not occur.

DESCRIPTION OF THE REFERENCE NUMERALS 1 piezoelectric actuator
2 inner electrode
21 first pole
22 second pole
3 piezoelectric layer
4 laminate
41 active portion
42 inactive portion
5 surface electrodes
51 first surface electrode
52 second surface electrode
53 third surface electrode
6 flexible substrate
61 wiring conductor
7 conductive bonding member
81 vibrating plate
82 bonding member
91 display
92 housing
921 housing main body
922 vibrating plate
93 bonding material

The invention claimed is:

1. A piezoelectric actuator comprising:
a piezoelectric element comprising:
a laminate in which inner electrodes and piezoelectric layers are stacked; and
surface electrodes on a first surface of the laminate, are electrically connected to the inner electrodes; and
a flexible substrate comprising a wiring conductor that is electrically connected to the surface electrodes, a part of the flexible substrate being bonded to the first surface via a conductive bonding member;
wherein at least a region where the flexible substrate is bonded to the first surface is not flat.

2. The piezoelectric actuator according to claim 1, wherein the inner electrodes include first poles and second poles, the first surface is provided with a stepped part between a relatively thick active portion where the first poles and the second poles are superposed on one another in a stacking direction and a relatively thin inactive portion other than the active portion, and
the flexible substrate is bonded to the first surface over the active portion and the inactive portion.

3. The piezoelectric actuator according to claim 1, wherein:
the piezoelectric element has an elongated shape having a longitudinal direction and a width direction,
the inner electrodes comprise first poles and second poles,
the first surface is provided with a stepped part between a relatively thick central region in the width direction where the first poles and the second poles of the inner electrodes are superposed on one another in a stacking direction and a relatively thin end region in the width direction other than the central region, and
the flexible substrate is bonded to the first surface over the central region in the width direction and the end region in the width direction.

4. The piezoelectric actuator according to claim 1, wherein a second surface is flat.

5. The piezoelectric actuator according to claim 1, wherein the conductive bonding member is an anisotropic conductive member.

6. A piezoelectric vibration apparatus comprising:
the piezoelectric actuator according to claim 1; and
a vibrating plate bonded to a second surface of the piezoelectric element.

7. The piezoelectric vibration apparatus according to claim 6, wherein the piezoelectric actuator is bonded to the vibrating plate by using a deformable bonding member.

8. A portable terminal comprising:
the piezoelectric actuator according to claim 1;
an electronic circuit;
a display; and
a housing,
wherein a second surface of the piezoelectric actuator is bonded to the display or the housing.

9. The portable terminal according to claim 8, wherein the piezoelectric actuator is bonded to the display or the housing by using a deformable bonding member.

* * * * *